(12) United States Patent
Inoke et al.

(10) Patent No.: US 7,163,104 B2
(45) Date of Patent: Jan. 16, 2007

(54) TRAY FOR SEMICONDUCTOR DEVICE AND SEMICONDUCTOR DEVICE

(75) Inventors: Misao Inoke, Kawasaki (JP); Yukio Ando, Kawasaki (JP); Hideyasu Hashiba, Kawasaki (JP)

(73) Assignee: Fujitsu Limited, Kawasaki (JP)

( * ) Notice: Subject to any disclaimer, the term of this patent is extended or adjusted under 35 U.S.C. 154(b) by 24 days.

(21) Appl. No.: 10/958,393

(22) Filed: Oct. 6, 2004

(65) Prior Publication Data

US 2005/0285282 A1 Dec. 29, 2005

(30) Foreign Application Priority Data

Jun. 28, 2004 (JP) ............................. 2004-189877

(51) Int. Cl.
*B65D 85/00* (2006.01)
(52) U.S. Cl. ...................... 206/726; 206/564; 206/821; 206/509
(58) Field of Classification Search ................ 206/701, 206/725, 726, 821, 509, 564
See application file for complete search history.

(56) References Cited

U.S. PATENT DOCUMENTS

| 5,400,904 | A |   | 3/1995 | Maston, III et al. |         |
|-----------|---|---|--------|--------------------|---------|
| 5,418,692 | A | * | 5/1995 | Nemoto             | 361/809 |
| 5,481,438 | A | * | 1/1996 | Nemoto             | 361/810 |
| 5,957,293 | A | * | 9/1999 | Pakeriasamy        | 206/725 |
| 6,357,595 | B1| * | 3/2002 | Sembonmatsu et al. | 206/726 |

FOREIGN PATENT DOCUMENTS

| JP | 6-27589      | 1/1988  |
| JP | 2852872      | 5/1995  |
| JP | 2000-318789  | 11/2000 |
| JP | 2001-28391   | 1/2001  |

\* cited by examiner

*Primary Examiner*—Jila M. Mohandesi
(74) *Attorney, Agent, or Firm*—Armstrong, Kratz, Quintos, Hanson & Brooks, LLP

(57) ABSTRACT

A tray for a semiconductor device and the semiconductor device are disclosed in which the resist of the semiconductor is not easily separated from the substrate. A tray for semiconductor device has a support section formed as a pocket for carrying the semiconductor device, a pair of first protrusions formed on the opposite sides of the support section, and a pair of second protrusions formed on the opposite sides of the tray on the surface side reverse to the surface side where the support section are provided. The second protrusions are arranged in spaced relation to and in the same direction as the first protrusions. The interval between the first protrusions is larger than the interval between the second protrusions, so that in the case where the tray receives a shock, the semiconductor device comes into contact with the second protrusions earlier than with the first protrusions, thereby making it difficult for the resist of the semiconductor device to come off.

4 Claims, 8 Drawing Sheets

TRAY FOR SEMICONDUCTOR DEVICE AND SEMICONDUCTOR DEVICE

BACKGROUND OF THE INVENTION

1. Field of the Invention

The present invention relates to a tray for a semiconductor device and a semiconductor device.

2. Description of the Related Art

Semiconductor devices such as semiconductor packages of BGA type are encased in a tray and conveyed in the tray. The tray has a body formed with a plurality of pockets, in each of which a semiconductor is encased. Each pocket includes a support section with the semiconductor placed thereon, and a pair of first protrusions arranged on the opposite sides of the support section. The first protrusions act as a position restricting means adapted to contact the opposed sides of the semiconductor device placed on the support section (refer to Japanese Unexamined Patent Publications No. 2001-28391 and No. 2000-318789, Japanese Utility Model Registration No. 6-27589, and Japanese Patent No. 2852872, for example). The interval between the first protrusions is equal to the semiconductor device (JP 2001-28391) or slightly larger than the length of the semiconductor device (JP 2002-318789). Therefore, the pair of the first protrusions can positively hold the semiconductor device in position.

Further, each pocket has a pair of second protrusions on the reverse surface side (lower surface side) of the tray where the support section is not provided. In the case where the semiconductor device is conveyed with the tray, a plurality of trays each encasing the semiconductor device are stacked one on another. In the case where two trays are stacked one on the another, the first protrusion pair of the lower tray and the second protrusion pair of the upper tray are located on the two sides of the semiconductor device supported on the support section of the lower tray. The interval between the first protrusions is substantially equal to or smaller than the interval between the second protrusions. Therefore, the first-protrusion pair defines the position of the semiconductor device, while the second protrusion pair does not define the position of a semiconductor device.

A semiconductor device such as the semiconductor package of BGA type includes a substrate, a semiconductor element mounted on the substrate, a sealing resin covering the semiconductor element, a resist arranged on the side of the substrate far from the semiconductor element and external terminals arranged in openings in the resist.

In the case where the tray receives a shock or is dropped while the semiconductor device is conveyed with the tray, the semiconductor device comes into contact with the first protrusions of the tray. In such a case, the resist of the semiconductor device may come off from the substrate. Then, protective function of the resist would, undesirably, be lost.

SUMMARY OF THE INVENTION

The object of the present invention is to provide a tray for a semiconductor device and a semiconductor device wherein the resist is not easily separated from the substrate.

According to one aspect of the present invention, there is provided a tray for a semiconductor device, comprising a body having a first surface side and a second surface side, a support section provided on the first surface side of the body for carrying the semiconductor device, a pair of first protrusions provided on the first surface side of the body on the opposite sides of the support section, and a pair of second protrusions provided on the second surface side of the body on the opposite sides of the support section, wherein an interval between the first protrusions is larger than an interval between the second protrusions.

With this configuration, if the tray is subjected to a shock or is dropped when the semiconductor device is being conveyed with the tray, the semiconductor device comes into contact with the second protrusions. In such a case, the sealing resin of the semiconductor device comes into contact with the second protrusions of the tray, and therefore the resist of the semiconductor device does not come into contact with the first protrusions. As a result, the resist of the semiconductor device is not separated from the substrate.

According to another aspect of the invention, there is provided a semiconductor device comprising a substrate, a semiconductor element mounted on the substrate, a sealing resin covering the semiconductor element, a resist arranged on the surface of the substrate far from the semiconductor element, and external terminals arranged in openings of the resist, wherein the peripheral portion of the resist is formed of a material higher in rigidity than the central portion thereof.

With this configuration, if the tray is subject to shock or is dropped when the semiconductor device is being conveyed with the tray and the semiconductor device comes into contact with the second protrusions under a shock, as the peripheral portion of the resist is formed of a material high in rigidity, the resist of the semiconductor device is not separated from the substrate. Further, the tray configuration described above makes it harder for the resist of the semiconductor device to come off from the substrate.

In the tray for the semiconductor device and the semiconductor device, according to this invention, therefore, the resist of the semiconductor device is not easily separated from the substrate even in the case where the tray in which the semiconductor device is being conveyed is subjected to a shock.

DESCRIPTION OF THE PREFERRED EMBODIMENTS

Figure 1:
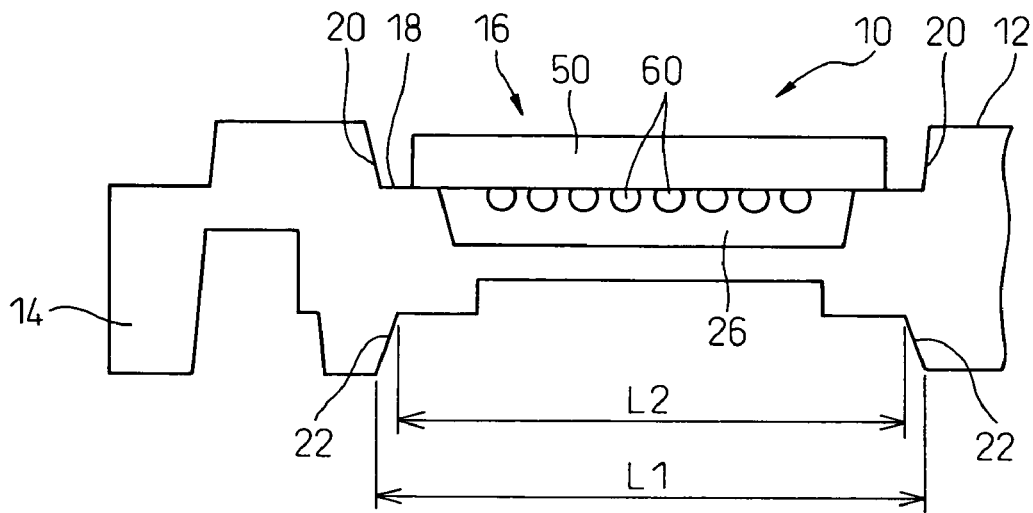
FIG. 1 is a schematic diagram showing a part of a tray according to the present invention supporting a semiconductor device.
Figure 2:
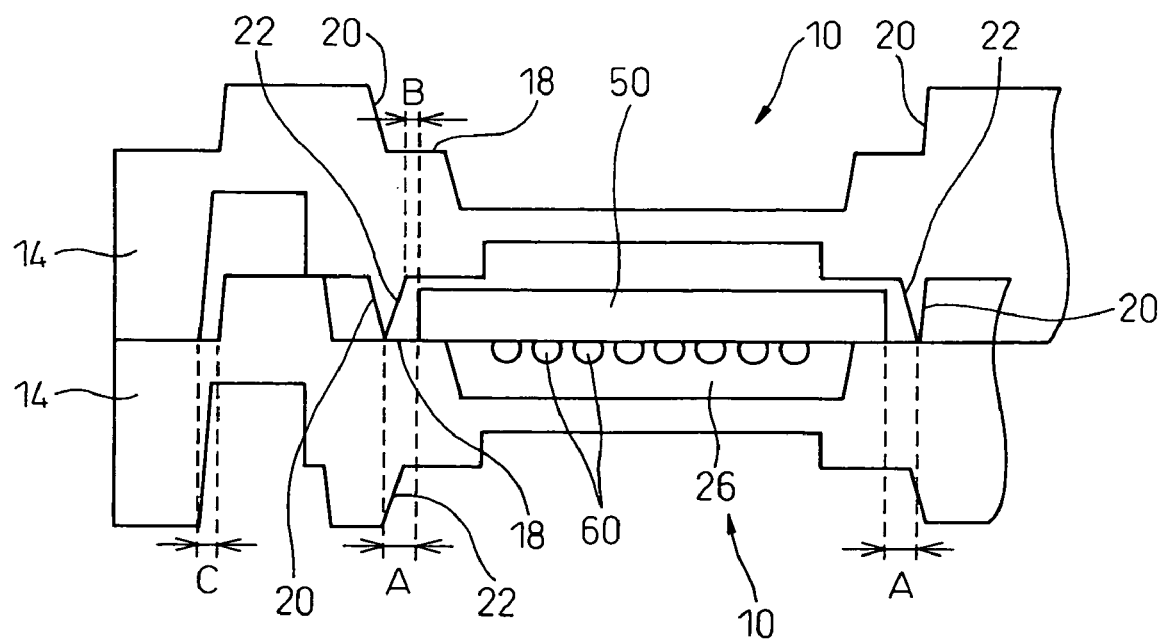
FIG. 2 is a schematic diagram showing a part of two trays stacked one on another.

Embodiments of the present invention are explained below with reference to the drawings. FIG. 1 is a schematic diagram showing a part of a tray, according to the present invention, for supporting a semiconductor device. FIG. 2 is a schematic diagram showing a part of two trays stacked one on another.

Figure 3:
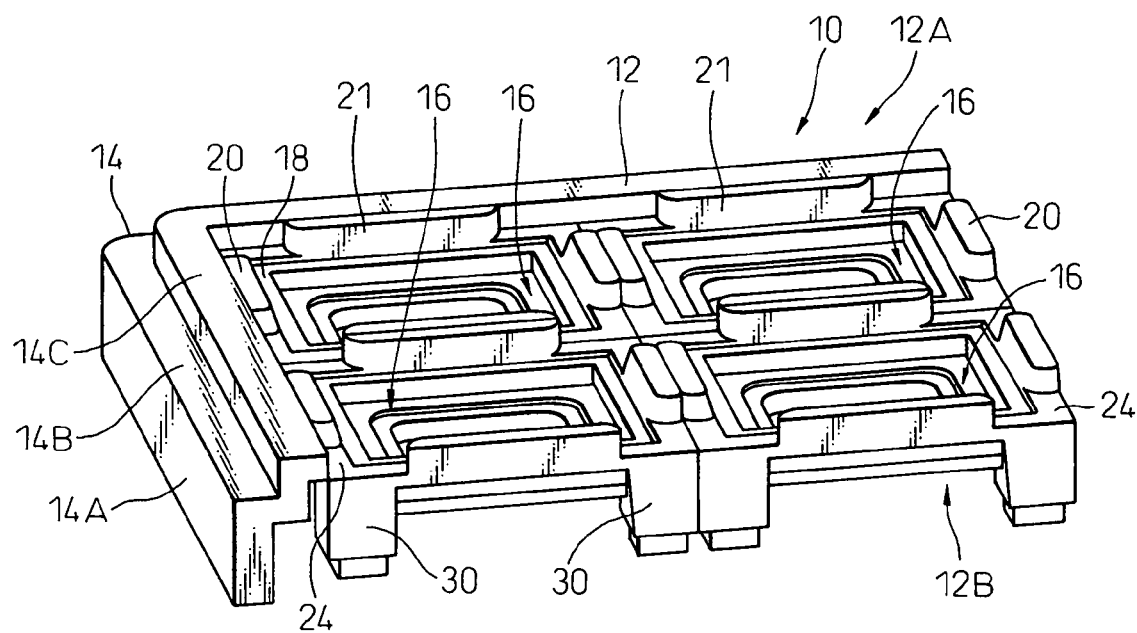
FIG. 3 is a top perspective view showing a part of the tray.
Figure 4:
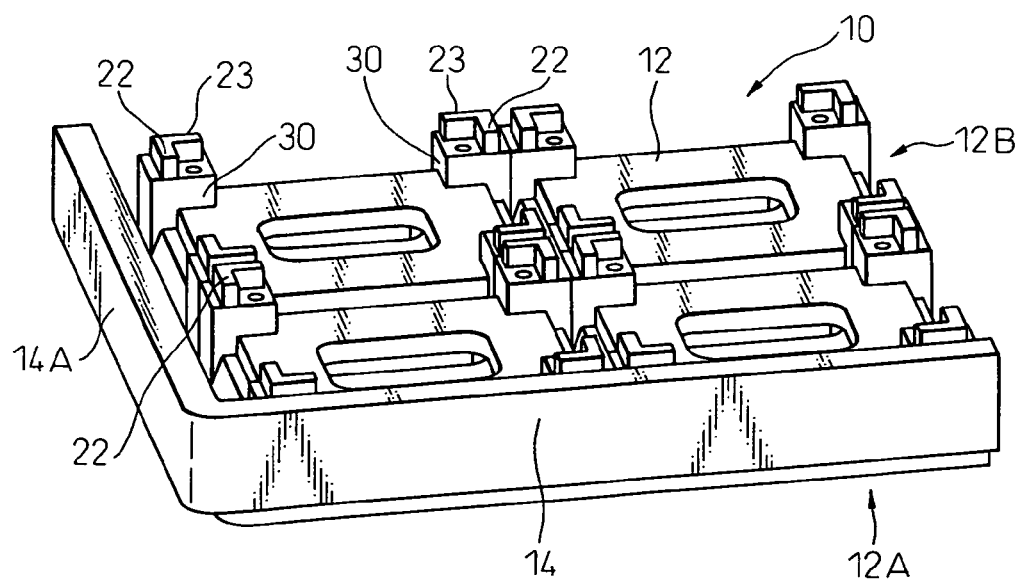
FIG. 4 is a bottom perspective view showing a part of the tray.

FIG. 3 is a top perspective view showing a part of the tray. FIG. 4 is a bottom perspective view showing a part of the tray. In FIGS. 3 and 4, a tray 10 comprises a body 12, which includes an upper surface side 12A and a lower surface side 12B. The body 12 has an outer frame 14 and a plurality of pockets 16. Only a part of the outer frame 14 and only four pockets 16 are shown in FIGS. 3 and 4. Actually, however, the outer frame section 14 is formed in a rectangular annular shape and a multiplicity of pockets 16 are provided in the rectangular annular outer frame 14. The outer frame 14 includes a leg portion 14A, an upper surface 14B of the leg portion 14A and an upper wall 14C rising inward as a step from the leg portion 14A.

Figure 5:
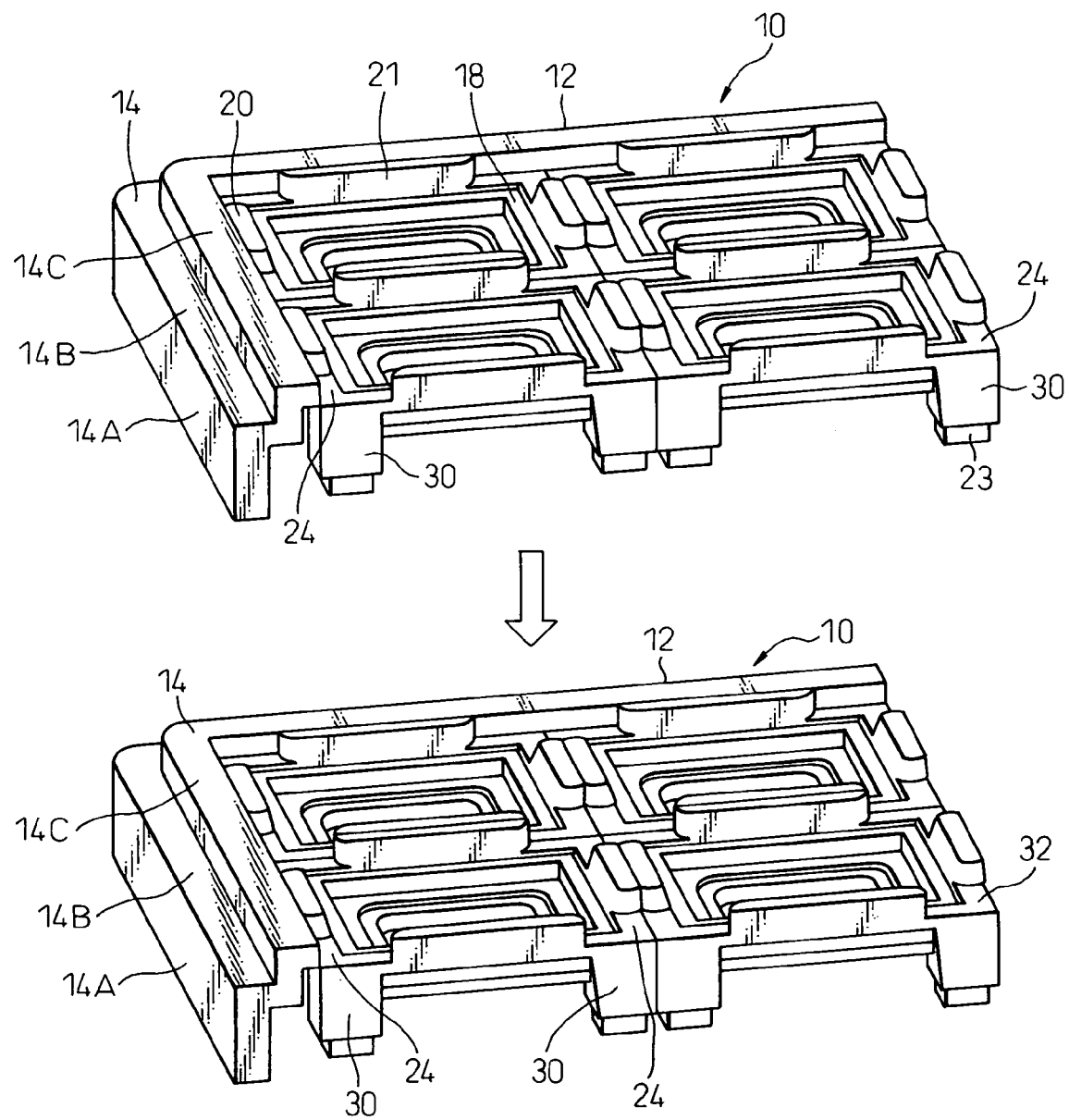
FIG. 5 is a perspective view showing a part of two trays in the process of being stacked.
Figure 6:
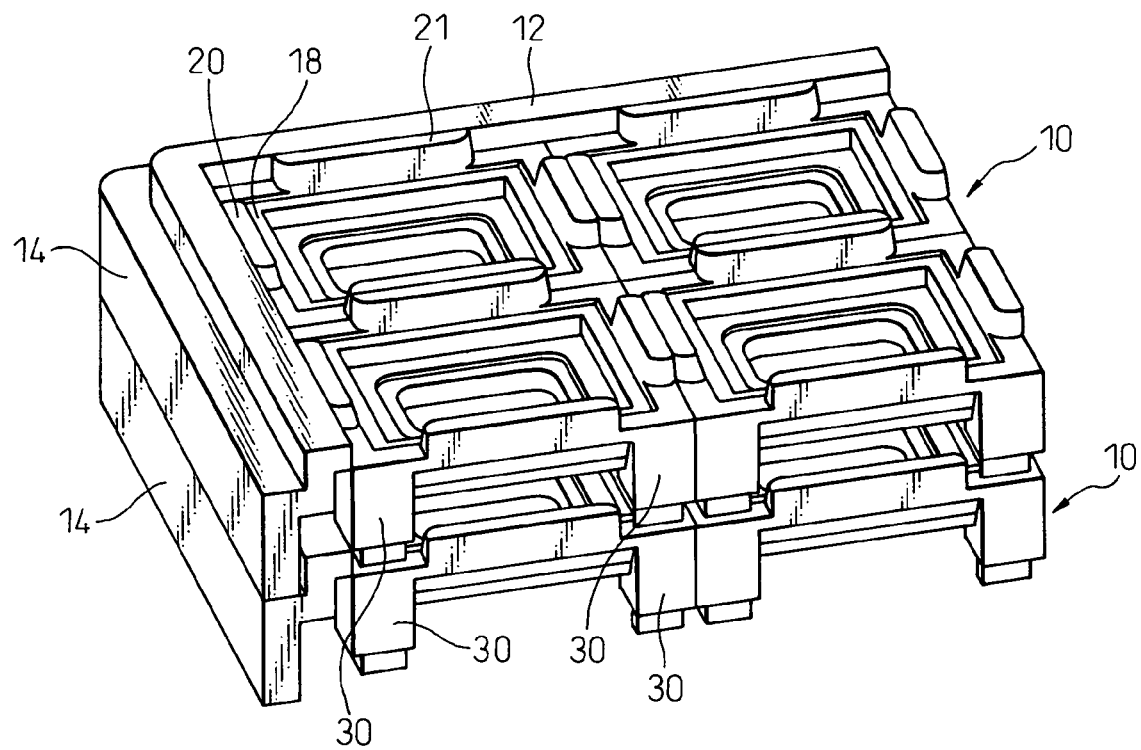
FIG. 6 is a perspective view showing a part of two trays stacked together.

FIG. 5 is a perspective view showing a part of two trays in the process of being stacked one on the another. FIG. 6 is a perspective view showing a part of the two trays stacked one on the another. As shown in FIGS. 5 and 6, the leg portion 14A of the outer frame 14 of the upper tray 10 is placed on the upper surface 14B of the leg portion 14A of the outer frame 14 of the lower tray 14, and therefore, the two trays can be stacked one on the another. After the two trays 10 are stacked in this way, the pockets 16 of the upper tray 10 come into registry with the pockets 16 of the lower tray 10. Further, a multiplicity of trays 10 can be stacked.

Figure 7:
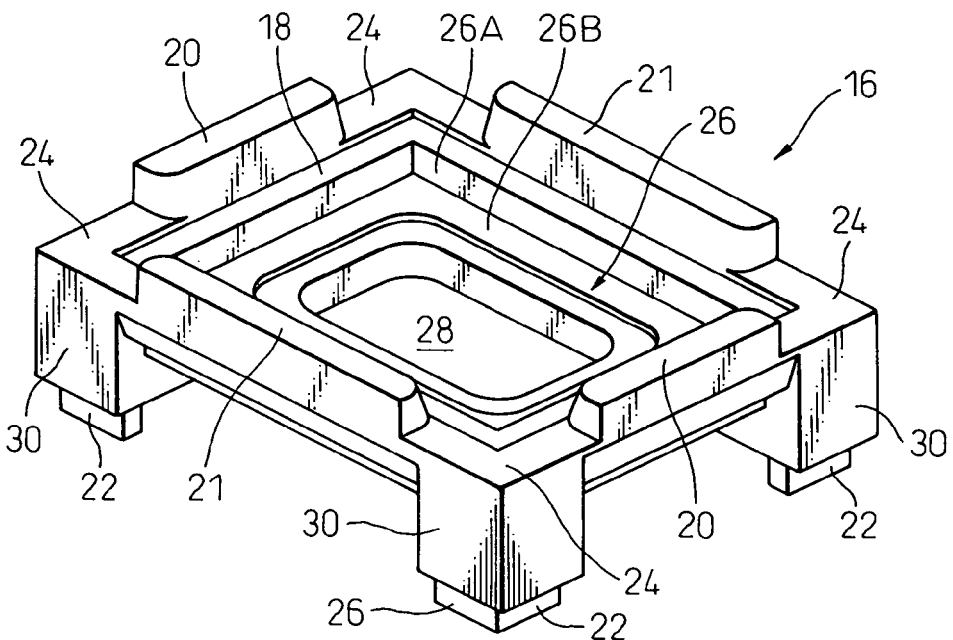
FIG. 7 is a perspective view showing a portion of the tray shown in FIG. 3 corresponding to one pocket.
Figure 8:
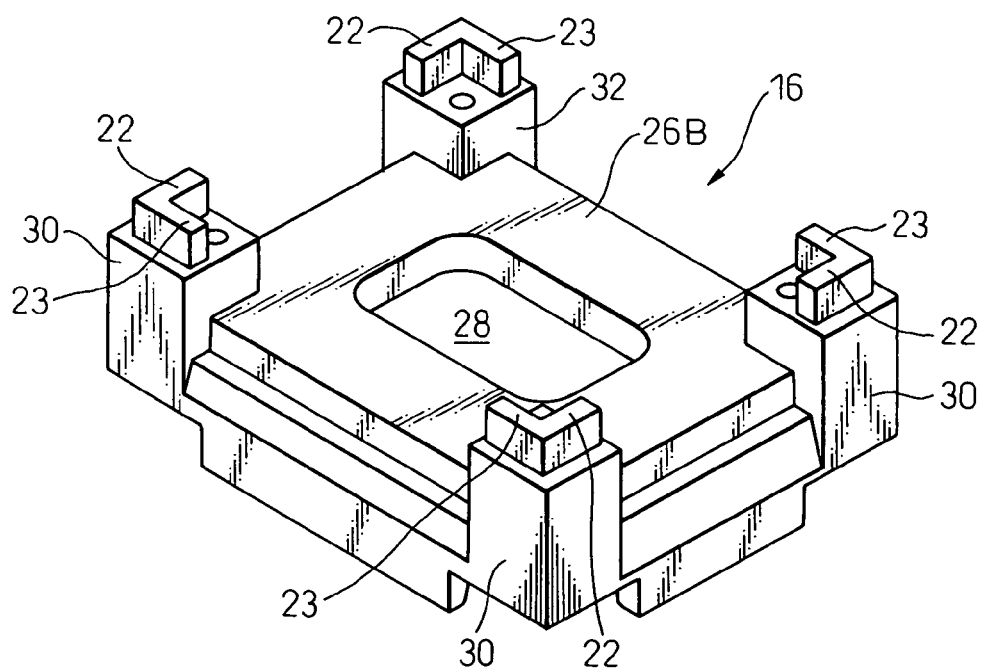
FIG. 8 is a perspective view showing a portion of the tray shown in FIG. 4 corresponding to one pocket.

FIG. 7 is a perspective view showing a portion of the tray 10 shown in FIG. 3 corresponding to one pocket 16. In other words, FIG. 7 is a top perspective view showing the portion of the tray 10 regarding one pocket 16. FIG. 8 is a perspective view showing a portion of the tray 10 shown in FIG. 4 corresponding to one pocket 16. In other words, FIG. 8 is a bottom perspective view showing a portion of the tray 10 regarding one pocket. These portions are all integrally formed as a part of the body 12.

Figure 9:
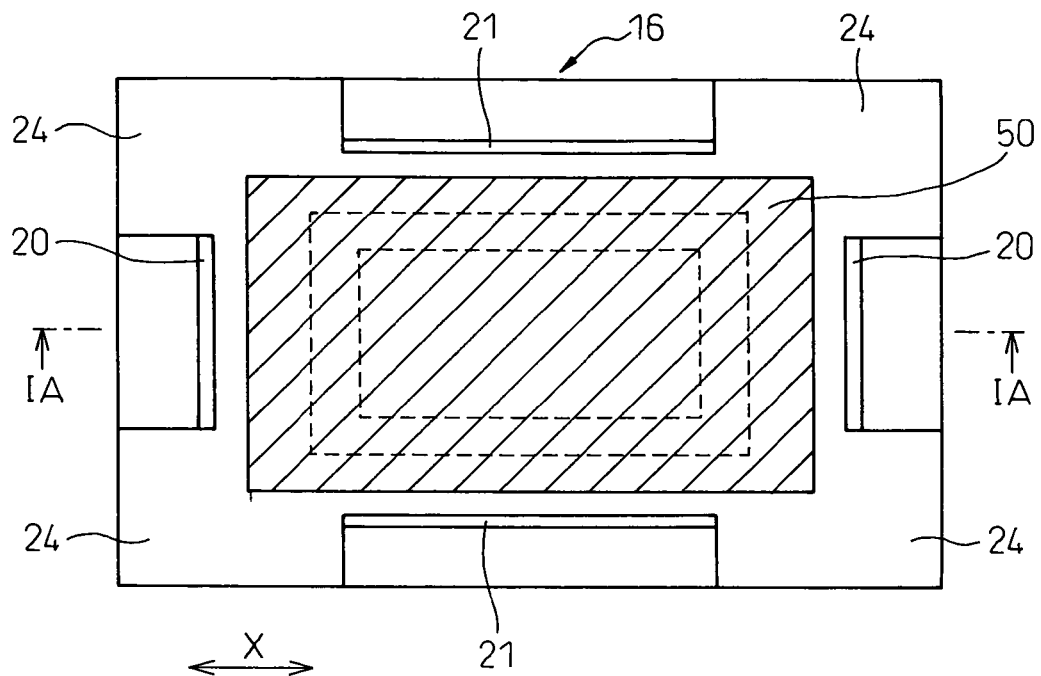
FIG. 9 is a plan view showing the portion of the pocket of the tray shown in FIG. 7.
Figure 10:
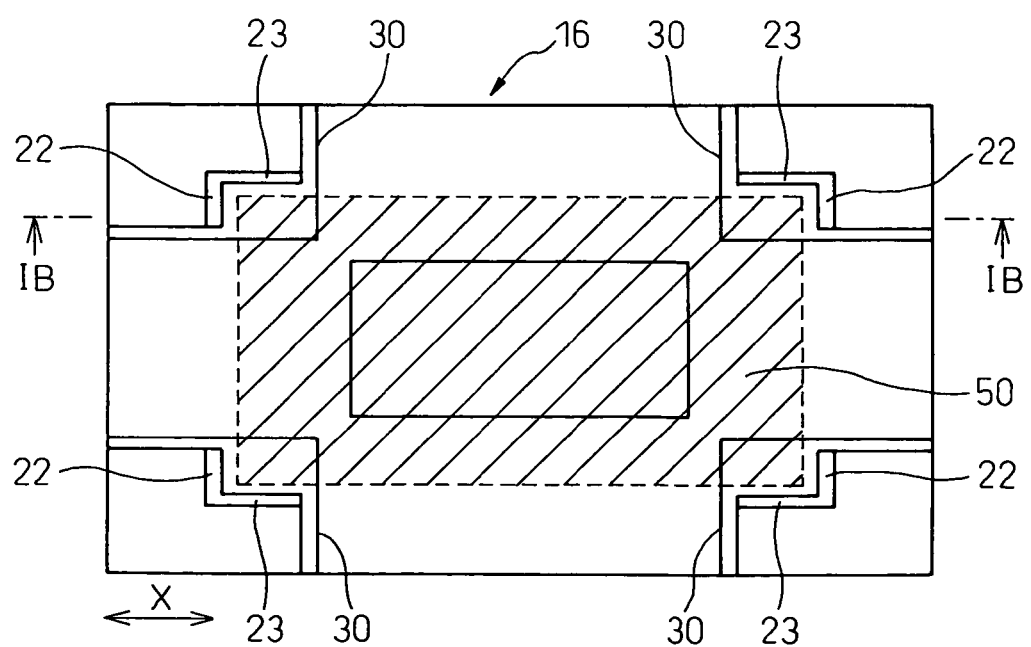
FIG. 10 is a plan view showing the portion of the pocket of the tray shown in FIG. 8.

FIG. 9 is a plan view showing a portion of the tray 10 shown in FIG. 7 corresponding to one pocket 16. In other words, FIG. 9 is a plan view of a portion of the tray 10 regarding one pocket 16. FIG. 10 is plan view showing a portion of the tray 10 shown in FIG. 8 corresponding one pocket 16. In other words, FIG. 10 is a bottom view of the pocket 16 of the tray 10.

FIG. 1 is a view taken in line IA—IA in FIG. 9 regarding first protrusions 20, and a view taken in line IB—IB in FIG. 10 regarding second protrusions 22. Specifically, FIG. 1 shows the relative positions of the first protrusions 20 and the second protrusions 22 in horizontal direction (X direction) in FIGS. 9 and 10. FIG. 2 is a diagram showing the trays in FIG. 1 stacked in two layers.

An explanation is given below mainly about a portion of the tray 10 corresponding to one pocket 16 with reference to FIGS. 7 to 10. The pocket 16 includes a support section 18 for carrying a semiconductor device 50, a pair of the first protrusions 20 formed on the two sides of the support section 18, and two pairs of the second protrusions 22 formed in spaced relation with each other in the same direction (X direction) as the first protrusions 20 on the two sides of the reverse surface side (lower surface side 12B) of the pocket 16 opposite to the side (upper surface side 12A) formed with the support section 18. Further, the upper surface side 12A is formed with a pair of third protrusions 21 in the direction perpendicular to the pair of the first protrusions 20. The two pairs of the second protrusions 22 are formed on the lower surface side 12B, and two pairs of fourth protrusions 23 are formed in the direction perpendicular to the two pairs of the second protrusions 22. The second protrusions 22 and the fourth protrusions 23 are arranged in the shape of L. An explanation is made below mainly about a pair of the first protrusions 20 and a pair of the second protrusions 22. A pair of the third protrusions 21 and a pair of the fourth protrusions 23 are formed in similar relative positions to a pair of the first protrusions 20 and a pair of the second protrusions 22.

As shown clearly in FIG. 7, the support section 18 is formed as an annular wall having a flat rectangular annular surface, and the first protrusions 20 rise up from the outer edge portions of the support section 18. The first protrusions 20 have inclined surfaces. The first protrusion 20 is located at the center of the opposed two sides of the rectangular pocket 16. The upper surfaces of the first protrusions 20 are formed substantially flush with the upper surface of the upper wall 14C of the outer frame 14 (FIG. 3). Flat rest portions 24 are formed on the opposite sides of the first protrusion 20.

A recess 26 is formed in the support section 18. When the outer peripheral portion of the lower surface of the semiconductor device 50 is supported by the annular support section 18, external terminals 60 of the semiconductor device 50 are accommodated in the recess 26 (FIG. 1). The recess 26 has an inclined wall 26A formed downward from the support section 18 and a horizontal wall 26B connected to the bottom of the inclined wall 26A. The horizontal wall 26B of the recess 26 is formed with an opening 28. The horizontal wall 26B and the opening 28 are shown also in FIG. 8.

Posts 30 extending downward are formed at four corners of the rectangular pocket 30. The second protrusions 22 and the fourth protrusions 23 are formed in the shape of L on the bottoms of the posts 30. The second protrusions 22 and the fourth protrusions 23 have inclined surfaces. The rests 24 correspond to the upper surfaces of the posts 30. In the case where two trays 10 are stacked, the second protrusions 22 and the fourth protrusions 23 on the bottom of the posts 30 of the upper tray 10 are placed on the rests 24 of the lower tray 10.

In FIG. 1, the interval L1 between a pair of the first protrusions 20 is larger than the interval L2 between a pair of the second protrusions 22. In this case, the interval is defined with reference to the lower ends of the inclined surfaces of the first protrusions 20 and the upper ends of the inclined surfaces of the second protrusions 22. In the case where the height of the second protrusions 22 is considerably larger than the height of the semiconductor device 50, however, the interval L2 is defined with reference to the position of the second protrusions 22 corresponding to the height of the semiconductor device 50. Therefore, when the two trays 10 are stacked while holding the semiconductor device 50 therebetween as shown in FIG. 2, the second protrusions 22 of the upper tray 10 are located nearer to the ends of the semiconductor device 50 than the first protrusions 20 of the lower tray 10.

Figure 12A:
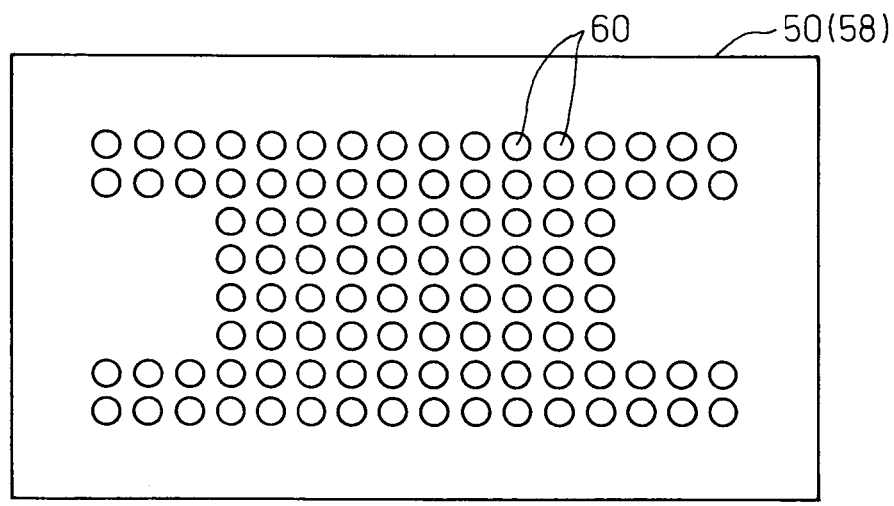
FIG. 12A is a bottom view showing an example of the semiconductor device.
Figure 12B:
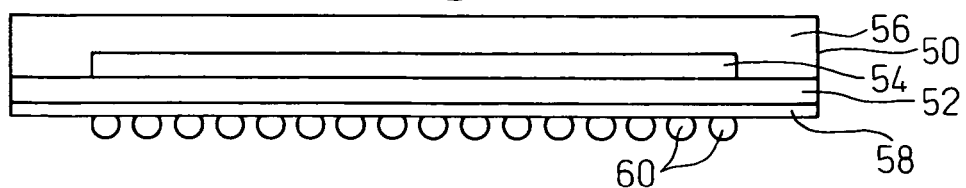
FIG. 12B is a sectional view of the semiconductor device of FIG. 12A.

FIGS. 12A and 12B show an example of the semiconductor device, in which FIG. 12A is a bottom view and FIG. 12B a sectional view. The semiconductor device 50 comprises a substrate 52, a semiconductor element 54 mounted on the substrate 52, a sealing resin 56 covering the semiconductor element 54, a resist 58 arranged on the side of the substrate 52 far from the semiconductor element 54 and external terminals 60 arranged in the openings of the resist 58. The external terminals 60 are formed of solder balls, and the semiconductor device 50 is of a BGA type.

Figure 13A:
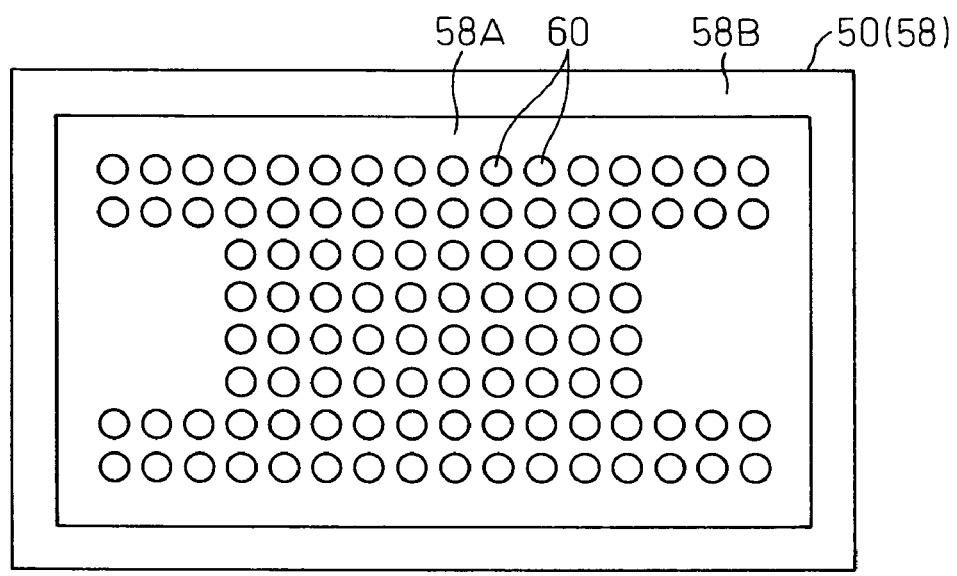
FIG. 13A is a bottom view showing another example of the semiconductor device.
Figure 13B:
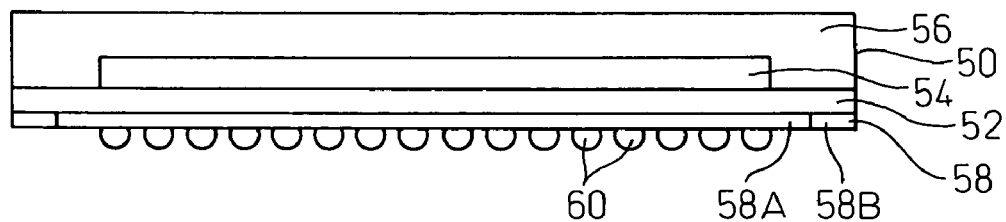
FIG. 13B is a sectional view of the semiconductor device of FIG. 13A.

FIGS. 13A and 13B show an example of the semiconductor device, in which FIG. 13A is a bottom view and FIG. 13B a sectional view. The semiconductor device 50 comprises a substrate 52, a semiconductor element 54 mounted on the substrate 52, a sealing resin 56 covering the semiconductor element 54, a resist 58 arranged on the side of the substrate 52 far from the semiconductor element 54 and external terminals 60 arranged in the openings of the resist 58. In FIGS. 13A and 13B, the peripheral portion 58B of the resist 58 is formed of a material higher in rigidity than the central portion 58A of the resist 58.

Figure 11:
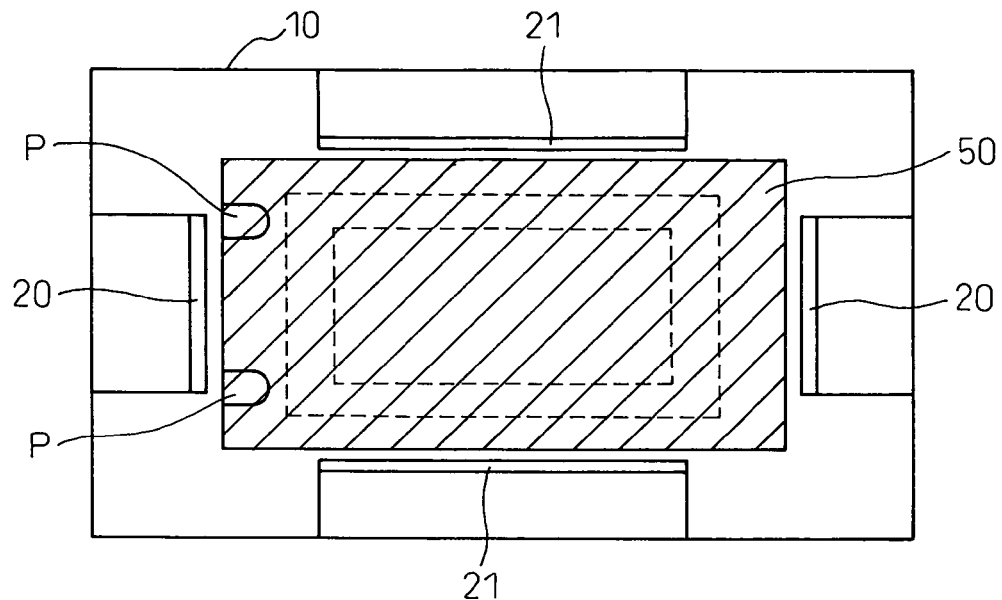
FIG. 11 is a diagram for explaining the case in which the first protrusions of the tray and the semiconductor device come into contact with each other.

FIG. 11 is a diagram for explaining the case in which the first protrusions 20 of the tray 10 and the semiconductor device 50 are in contact with each other. In the case where the tray 10 receives a shock or is dropped, the semiconductor device 50 may come into contact with the first protrusions 20 of the tray 10. Then, the resist 58 of the semiconductor device 50 may be separated from the substrate 52. Once the resist 58 is separated from the substrate 52, the protective function of the resist 58 is undesirably lost. Especially, as shown in FIGS. 12A to 13B, the resist 58 is located on the bottom of the semiconductor device 50, and therefore the outer edge of the resist 58 comes into the lower end of the slope of the first protrusion 20 so that the resist 58 is easily separated from the substrate 52 at a position P, for example.

As shown in FIGS. 1 and 2, the interval L1 between a pair of the first protrusions 20 is larger than the interval L2 between a pair of the second protrusions 22. In this configuration, if the tray 10 receives a shock or is dropped, the semiconductor device 50 comes into contact with the second protrusions 22 before the first protrusions 20 contact the tray 10. In this case, the second protrusions 22 are inclined downward, and therefore the sealing resin 56 of the semiconductor device 50 comes into contact with the second protrusions 22 thereby avoiding the bumping with the resist 58. The sealing resin 56 is higher in rigidity and harder to break than the resist 58, and therefore not easily separated or damaged. Thus, the resist 58 is not separated from the substrate 52.

As described above, according to the present invention, the first protrusions 20 and the second protrusions 22 are formed in such a manner that the semiconductor 50 comes into contact with the second protrusions 22 before the first protrusions 20. This feature can be defined as the following relation as well as the relation between L1 and L2 described above. Specifically, the relation $A \geq B+C$ is maintained, where A is the interval between the semiconductor device 50 and the first protrusion 20, B the interval between the semiconductor device 50 and the second protrusion 22 and C the fitting clearance between the outer frames 14. The simple relation $A \geq B$ is equivalent to the relation between L1 and L2 described above. In the presence of the fitting clearance C between the outer frames when the two trays 10 are stacked one on the another, however, the upper tray 10 and the lower tray 10 may be displaced from each other. In the case where the relation $A \geq B+C$ is maintained, however, the semiconductor device 50 always comes into contact with the second protrusions 22 before the first protrusions 20 of the tray 10 even when the upper tray 10 and the lower tray 10 are displaced from each other.

In this configuration, when the semiconductor device 50 receives a shock, the second protrusions 22 of the tray 10 come into contact with the sealing resin 56 of the semiconductor device 10, and the resist 58 is kept out of contact with the first protrusions 20. Therefore, the resist 58 is not separated from the substrate 52. Further, in the case where the peripheral portion 58B of the resist 58 is formed of a material higher in rigidity than the central portion 58A of the resist 58, the resist 58 is not easily separated from the substrate 52 even when the resist 58 comes into contact with the first protrusions 20.

It will thus be understood from the foregoing description that, according to this invention, the semiconductor device comes into contact with the second protrusions earlier than with the first protrusions, and therefore the resist of the semiconductor device is prevented from coming off from the substrate. Also, only that portion of the resist formed on the substrate of the semiconductor device which comes into contact with the tray is formed of a material high in rigidity, so that the resist is hard to separate.

The invention claimed is:

1. A tray for a semiconductor device, comprising:
   a body having a first surface side and a second surface side;
   a support section provided on the first surface side of the body for carrying the semiconductor device;
   a pair of first, upward protrusions provided on the first surface side of the body on the opposite sides of said support section; and
   a pair of second, downward protrusions provided on the second surface side of the body on the opposite sides of said support section;
   wherein, when a plurality of trays are stacked one on another, the support section further defines a space in which the semiconductor device is accommodated between the first surface side of one tray and the second surface side of the other tray; and
   wherein the second downward protrusions rest on a support section intermediate the upward protrusions; and
   wherein an interval between said first protrusions is larger than an interval between said second protrusions, so that, when the semiconductor device is moved along the support in the support section, a peripheral edge of the semiconductor device first comes into contact with the second protrusions.

2. The tray according to claim 1, wherein said support section comprises an annular wall having a flat surface, and a recess is formed in said support section for accommodating external terminals of the semiconductor device.

3. The tray according to claim 1, wherein said first and second protrusions have inclined surfaces.

4. A tray for semiconductor devices, comprising:
   a body having a first surface side and a second surface side;
   an outer frame section provided on the body;
   a plurality of support sections provided on the first surface side of the body for carrying the semiconductor devices;
   a pair of first protrusions provided on the first surface side of the body on the opposite sides of each said support section; and
   a pair of second protrusions provided on the second surface side of the body on the opposite sides of each said support section; and wherein, when a plurality of trays are stacked one on another, the support section further defines a space in which the semiconductor device is accommodated between the first surface side of one tray and the second surface side of the other tray; and wherein the second downward protrusions rest on a support section intermediate the upward protrusions; and wherein an interval between said first protrusions is larger than an interval between said second protrusions, so that, when the semiconductor device is moved alone the support in the support section, a peripheral edge of the semiconductor device first comes into contact with the second protrusions.

* * * * *